United States Patent
Khaw

(10) Patent No.: US 10,044,328 B2
(45) Date of Patent: Aug. 7, 2018

(54) TRANSIMPEDANCE AMPLIFIER WITH BANDWIDTH EXTENDER

(71) Applicant: MACOM Technology Solutions Holdings, Inc., Lowell, MA (US)

(72) Inventor: Michael P. Khaw, Portland, OR (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 224 days.

(21) Appl. No.: 14/839,747

(22) Filed: Aug. 28, 2015

(65) Prior Publication Data

US 2017/0026011 A1   Jan. 26, 2017

Related U.S. Application Data

(60) Provisional application No. 62/194,745, filed on Jul. 20, 2015.

(51) Int. Cl.
   *H03F 3/08* (2006.01)
   *H03F 1/22* (2006.01)
   (Continued)

(52) U.S. Cl.
   CPC ............. *H03F 3/082* (2013.01); *H03F 1/086* (2013.01); *H03F 1/223* (2013.01); *H03F 1/48* (2013.01);
   (Continued)

(58) Field of Classification Search
   CPC ............. H03F 3/08; H03F 3/082; H03F 3/087
   See application file for complete search history.

(56) References Cited

U.S. PATENT DOCUMENTS

| 4,534,064 A | 8/1985 | Giacometti et al. |
| 4,864,649 A | 9/1989 | Tajima et al. |

(Continued)

FOREIGN PATENT DOCUMENTS

| EP | 0606161 | 4/2000 |
| JP | 2001-119250 | 4/2015 |

OTHER PUBLICATIONS

Abhijit Phanse, National Semiconductor, "Exercise 2: Define the time variance of a fiber optic channel's Impulse Response, and suggest a method for measuring it", IEEE 802.3ae, Nov. 2000, 13 pages.

(Continued)

*Primary Examiner* — Thanh Luu
(74) *Attorney, Agent, or Firm* — Weide & Miller, Ltd.

(57) ABSTRACT

A transimpedance amplifier that includes an input configured to receive a current input from an upstream device and output configured to present an output voltage. The current input may be from a photodetector or any other device that is part of an optical signal receiving unit front end. In one configuration, there are three amplifier stages in the transimpedance amplifier connected in series. A feedback path with feedback resistor connects between the input and output of the transimpedance amplifier. A bandwidth extender circuit connects between a stage output and a stage input of the transimpedance amplifier. In a three stage embodiment, the bandwidth extender circuit extends between an input of the second stage and the output of the second stage. The bandwidth extender includes at least one active device configured to provide positive feedback to increase gain. The bandwidth extender circuit is able to be automatically or selectively deactivated to filter unwanted frequency components.

12 Claims, 11 Drawing Sheets

(51) Int. Cl.
*H03F 1/48* (2006.01)
*H03F 1/08* (2006.01)

(52) U.S. Cl.
CPC .......... *H03F 3/08* (2013.01); *H03F 2200/36* (2013.01); *H03F 2200/405* (2013.01); *H03F 2200/408* (2013.01)

(56) References Cited

U.S. PATENT DOCUMENTS

| | | | |
|---|---|---|---|
| 5,019,769 A | 5/1991 | Levinson | |
| 5,293,405 A | 3/1994 | Gersbach et al. | |
| 5,383,046 A | 1/1995 | Tomofuji et al. | |
| 5,383,208 A | 1/1995 | Queniat et al. | |
| 5,394,416 A | 2/1995 | Ries | |
| 5,396,059 A | 3/1995 | Yeates | |
| 5,471,501 A | 11/1995 | Parr et al. | |
| 5,491,548 A | 2/1996 | Bell et al. | |
| 5,532,471 A | 7/1996 | Khorramabadi et al. | |
| 5,594,748 A | 1/1997 | Jabr | |
| 5,710,660 A | 1/1998 | Yamamoto et al. | |
| 5,812,572 A | 9/1998 | King et al. | |
| 5,844,928 A | 12/1998 | Shastri et al. | |
| 5,892,220 A | 4/1999 | Woodward | |
| 5,900,959 A | 5/1999 | Noda et al. | |
| 5,956,168 A | 9/1999 | Levinson et al. | |
| 6,005,240 A | 12/1999 | Krishnamoorthy | |
| 6,081,362 A | 6/2000 | Hatakeyama et al. | |
| 6,108,113 A | 8/2000 | Fee | |
| 6,111,687 A | 8/2000 | Tammela | |
| 6,282,017 B1 | 8/2001 | Kinoshita | |
| 6,366,373 B1 | 4/2002 | MacKinnon et al. | |
| 6,397,090 B1 | 5/2002 | Cho | |
| 6,452,719 B2 | 9/2002 | Kinoshita | |
| 6,494,370 B1 | 12/2002 | Sanchez | |
| 6,556,601 B2 | 4/2003 | Nagata | |
| 6,657,488 B1 | 12/2003 | King et al. | |
| 6,661,940 B2 | 12/2003 | Kim | |
| 6,707,600 B1 | 3/2004 | Dijaili et al. | |
| 6,720,826 B2 | 4/2004 | Yoon | |
| 6,740,864 B1 | 5/2004 | Dries | |
| 6,801,555 B1 | 10/2004 | Dijaili et al. | |
| 6,828,857 B2 | 12/2004 | Paillet et al. | |
| 6,837,625 B2 | 1/2005 | Schott et al. | |
| 6,852,966 B1 | 2/2005 | Douma et al. | |
| 6,864,751 B1 | 3/2005 | Schmidt et al. | |
| 6,868,104 B2 | 3/2005 | Stewart et al. | |
| 6,879,217 B2 | 4/2005 | Visocchi | |
| 6,888,123 B2 | 5/2005 | Douma et al. | |
| 6,909,731 B2 | 6/2005 | Lu | |
| 6,934,479 B2 | 8/2005 | Sakamoto et al. | |
| 6,941,077 B2 | 9/2005 | Aronson et al. | |
| 6,952,531 B2 | 10/2005 | Aronson et al. | |
| 6,956,643 B2 | 10/2005 | Farr et al. | |
| 6,957,021 B2 | 10/2005 | Aronson et al. | |
| 6,967,320 B2 | 11/2005 | Chieng et al. | |
| 7,031,574 B2 | 4/2006 | Huang et al. | |
| 7,039,082 B2 | 5/2006 | Stewart et al. | |
| 7,049,759 B2 | 5/2006 | Roach | |
| 7,050,720 B2 | 5/2006 | Aronson et al. | |
| 7,058,310 B2 | 6/2006 | Aronson et al. | |
| 7,066,746 B1 | 6/2006 | Togami et al. | |
| 7,079,775 B2 | 7/2006 | Aronson et al. | |
| 7,127,391 B2 | 10/2006 | Chang et al. | |
| 7,184,671 B2 | 2/2007 | Wang | |
| 7,193,957 B2 | 3/2007 | Masui et al. | |
| 7,215,891 B1 | 5/2007 | Chiang et al. | |
| 7,233,206 B2 | 6/2007 | Murakami et al. | |
| 7,269,194 B2 | 9/2007 | Diaz et al. | |
| 7,381,935 B2 | 6/2008 | Sada et al. | |
| 7,403,064 B2 | 7/2008 | Chou et al. | |
| 7,741,908 B2 | 6/2010 | Furuta | |
| 2001/0046243 A1 | 11/2001 | Schie | |
| 2002/0105982 A1 | 8/2002 | Chin et al. | |
| 2002/0153949 A1* | 10/2002 | Yoon | H03F 3/082 330/69 |
| 2003/0067662 A1 | 4/2003 | Brewer et al. | |
| 2003/0122057 A1 | 7/2003 | Han et al. | |
| 2004/0047635 A1 | 3/2004 | Aronson et al. | |
| 2004/0095976 A1 | 5/2004 | Bowler et al. | |
| 2004/0136727 A1 | 7/2004 | Androni et al. | |
| 2004/0202215 A1 | 10/2004 | Fairgrieve | |
| 2004/0240041 A1 | 12/2004 | Tian et al. | |
| 2005/0024142 A1 | 2/2005 | Sowlati | |
| 2005/0062530 A1 | 3/2005 | Bardsley et al. | |
| 2005/0168319 A1 | 8/2005 | Bhattacharya et al. | |
| 2005/0180280 A1 | 8/2005 | Hoshino | |
| 2005/0215090 A1 | 9/2005 | Harwood | |
| 2006/0125557 A1 | 6/2006 | Manstretta | |
| 2006/0261893 A1 | 11/2006 | Chiang et al. | |
| 2006/0278813 A1 | 12/2006 | Iesaka | |
| 2008/0055005 A1 | 3/2008 | Nam et al. | |
| 2008/0309407 A1 | 12/2008 | Nakamura et al. | |
| 2012/0201260 A1 | 8/2012 | Nguyen et al. | |

OTHER PUBLICATIONS

Garth Nash, "AN 535 Application Notes—Phase-Locked Loop Design Fundamentals", Motorola, Inc., 1994, 3 pages.

Ron Bertrand, "The Basics of PLL Frequency Synthesis", Online Radio & Electronics Course, Apr. 2002, 9 pages.

Single-Ended vs. Differential Methods of Driving a Laser Diode, Maxim Integrated™, Application Note: HFAN-2.5.0, Rev. 5; Oct. 2008, 5 pages.

Miller Effect—Wikipedia, the free encyclopedia, http://en.wikipedia.org/wiki/Miller_effect, Mar. 9, 2015.

* cited by examiner ns with promise of ultra-high sensitivity but require minimum photodiode capacitances to achieve such low input referred noise (IRN). While it is a possible solution, it is not without drawbacks. Low capaci-

TRANSIMPEDANCE AMPLIFIER WITH BANDWIDTH EXTENDER

PRIORITY CLAIM

This application claims priority to and the benefit of U.S. Provisional Patent Application No. 62/194,745 filed on Jul. 20, 2015, the contents of which are incorporated by reference in its entirety herein.

FIELD OF THE INVENTION

The invention relates to transimpedance amplifiers and in particular to a method and apparatus for selectively improving the bandwidth capability of transimpedance amplifiers.

RELATED ART

In electronics, a transimpedance amplifier, (TIA) is a widely used device configured as a current-to-voltage converter, most often implemented using an operational amplifier. The TIA can be used to amplify[1] the current output of Geiger-Müller tubes, photo multiplier tubes, accelerometers, photodetectors, such as but not limited to photodetectors in fiber optic communication systems, as well as other types of sensors to generate a usable voltage. Current-to-voltage converters are also often used with sensors that have a current response that is more linear than the voltage response. This is the case with photodiodes where it is not uncommon for the current response to have better than 1% linearity over a wide range of light input. Thus, the transimpedance amplifier ideally presents a low impedance to the photodiode and isolates it from the output voltage of the operational amplifier. One common factor of transimpedance amplifiers is an ability to convert the low-level current of a sensor to a voltage. The gain, bandwidth, current and voltage offsets change with different types of sensors (such as photodetectors), requiring different configurations of transimpedance amplifiers.

When configured in a communication system or data exchange system, the bandwidth of the transimpedance amplifier is of importance due to the trend for communication systems to operate at higher speeds with each new product release. One aspect of a TIA that affects bandwidth capabilities is an ability to support a wide range of input capacitance. This is an important requirement for TIA for optical communication applications. Maintaining sufficient bandwidth during operation of transimpedance amplifiers under various input capacitance is also an important requirement.

As demand continues to increase for high sensitivity of the TIA along with lower cost TIA designs, the main driving force is to replace the APD-based receivers (avalanche photodiode) with the PIN-based (p-i-n photodiode) type devices. APD-based receivers are more expensive due to higher cost to manufacture and require external circuitry to control temperature compensation.

A typical PIN-based optical receiver consists of a photodiode and a TIA. It is well known that the photodiode capacitance at the input of a TIA can significantly degrade the bandwidth and the sensitivity. Recently, new generation of Super-TIAs became available with promise of ultra-high sensitivity but require minimum photodiode capacitances to achieve such low input referred noise (IRN). While it is a possible solution, it is not without drawbacks. Low capacitance photodetectors require small optical apertures which are more expensive to manufacture due to low production yield. Therefore, there is a need in the art to develop a TIA topology which has high tolerance and flexibility to accommodate a wide input capacitance range, thereby providing a cost effective and widely application solution.

In addition, with cost still a controlling factor, more and more inexpensive lasers are now commonly used in 2.5 Gbps data rate applications. However, such low cost lasers are known to exhibit laser relaxation oscillation phenomena at certain frequency as shown in FIG. 1).

FIG. 1 illustrates an exemplary plot of optical signal magnitude over time. The horizontal axis 112 represents time while the vertical axis 116 represents signal magnitude. The plots, which are overlapping and collective, show poor signal eye quality due to laser relaxation oscillation. Laser relaxation frequency is induced by unwanted coherent optical feed-back from an external target. The problem with laser relaxation oscillation is its high frequency content introduces aberration glitches that reduce receiver eye opening and thus greatly degrade receiver sensitivity. This interferes with a receiver's ability to accurately recover the transmitted signal.

A number of TIA designs are possible. FIGS. 2A & 2B, both single stage and multistage-stage amplifiers are commonly used in TIA designs. As shown in FIG. 2A, the TIA 204 an optical signal input 208, such as from an optical fiber 212. A photodetector 216 receives the optical signal 208. Any type photodetector 216 may be used subject to meeting specification requirements for the TIA and application of the TIA. The photodetector 216 is connected between a ground node 216 an input to an amplifier 230. The photodetector 216 has an inherent capacitance Cpd 224. The capacitance Cpd 224 is not a separate element, but is part of the photodetector 216 and will vary with the brand and type of photodetector used in the TIA 204.

The optical signal presented to the photodetector 216 is converted to an electrical signal and sent to the amplifier 230. The amplifier 230 may comprise an operational amplifier or any type of low noise amplifier capable of serving in a TIA environment and amplifying the output of a photodetector 216. The output of the amplifier 230 is presented on the TIA output 240 and fed back through a resistor RF 234 to the input of the TIA. The resistor RF 234 and the amplifier are part of the TIA and typically co-located on an integrated circuit. The resistor RF 234 in the feedback path converts the input current to a voltage and set the gain of the amplifier. Gain is defined as Vout/Iin=RF.

The TIA design may be expanded multiple stages as shown in FIG. 2B. FIG. 2B illustrates a block diagram of an exemplary multistage-stage amplifiers in a TIA. As compared to FIG. 2A, identical or similar elements are labeled with identical reference numbers. In this embodiment, a first stage amplifier 230 connects to one or more additional stages, shown by dashed line, up to an Ntn stage amplifier 230N. By adding additional stages, gain can be increased.

Prior art TIA designs, such as that shown in FIGS. 2A and 2B, are very sensitive to input photodetector capacitance Cpd and lack capability to improve eye quality deterioration that is caused by the laser relaxation oscillation blow-by.

The innovation described below overcomes these drawbacks in the prior art and provides additional benefits.

SUMMARY

A novel photodetector with a transimpedance amplifier is disclosed that includes a photodetector configured to receive and process an optical signal to generate a photodetector output that represents the optical signal. A transimpedance amplifier is configured to receive the photodetector output. The transimpedance amplifier has a transimpedance amplifier input and a transimpedance amplifier output. The transimpedance amplifier includes a first stage that includes a transistor and a load element such that the first stage is connected to the photodetector output and also includes a first stage output.

A second stage is also part of this embodiment and it includes a transistor and a load element such that the second stage has an input that is connected to the first stage output. The second stage has a second stage output. A third stage comprising a transistor and a load element, the third stage having an input connected to the second stage output. The output of the third stage forms the transimpedance amplifier output. Also part of this embodiment is a feedback loop including feedback resistor such that the feedback loop is connected between the transimpedance amplifier output and the transimpedance amplifier input. A bandwidth extender is also part of this embodiment. The bandwidth extender includes an active element connected between the first stage output and the second stage output.

In one configuration, the active element in the bandwidth extender is a FET such that the FET has a gate terminal connected to the second stage output and a drain terminal connected to the first stage output. The bandwidth extender may be configured to provide positive feedback from the second stage output to the first stage output to increase the gain of the transimpedance amplifier. The transimpedance amplifier may further include a switch configured to receive an enable signal that selectively enables or disables the bandwidth extender. In one configuration, the first stage, second stage, and third stage include a FET acting as an amplifier and an active load.

A transimpedance amplifier is disclosed that includes an input configured to receive the transimpedance amplifier input signal and one or more amplifiers stages such that each of the one or more stages has a stage input and a stage output. Also part of the transimpedance amplifier is a bandwidth extender connected between a stage output and a stage input, the bandwidth extender including at least one active device configured to provide positive feedback from the stage output to the stage input.

In one embodiment, the bandwidth extender is configured to be selectively enabled and disabled. The step of selective enabling and disabling is responsive to a control signal. Disabling the bandwidth extender filters out high frequency content of a relaxation oscillation signal. In one configuration the one or more stages consist of one stage with an input and an output, and the bandwidth extender is connected between the one stage input and the one stage output. In another embodiment, the one or more stages comprise a first stage, a second stage, a third stage, a fourth stage and a fifth stage, such that each stage has an input and an output, and the bandwidth extender is connected between a second stage input and a fourth stage output.

Also disclosed herein is a method for processing a photodetector output with a transimpedance amplifier to generate a corresponding amplified voltage. In this exemplary embodiment, this method includes receiving the photodetector output current at a first stage amplifier of a transimpedance amplifier that has one or more amplifier stages. The transimpedance amplifier also receives a feedback signal from a feedback path at the first stage amplifier such that the feedback path includes feedback resistor. Then amplifying the feedback signal and the photodetector output with the one or more amplifier stages to generate a transimpedance amplifier output signal. The transimpedance amplifier output signal is then presented as an input to the feedback path. This method of operation also performs bandwidth enhancement by amplifying an amplifier stage output signal from one of the one or more amplifier stage and presents the amplifier stage output signal to an input of the one or more amplifier stages to increase the gain of at least one amplifier stage to thereby increase the bandwidth of the transimpedance amplifier.

This method of operation may also include receiving a control signal to selectively enable or disable bandwidth enhancement. The method of operation may also include the step of detecting unwanted high frequency content in the transimpedance amplifier output or photodetector output, such as by filtering, and responsive thereto disabling the bandwidth enhancement. The one or more stages may be three stages. In one configuration, the photodetector or transimpedance amplifier operates at 2.5 Gbps data rate or higher. In one embodiment, the method is performed in a ROSA package of a passive optical network. The step of performing bandwidth enhancement may occur by amplifying an amplifier stage output signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 3:
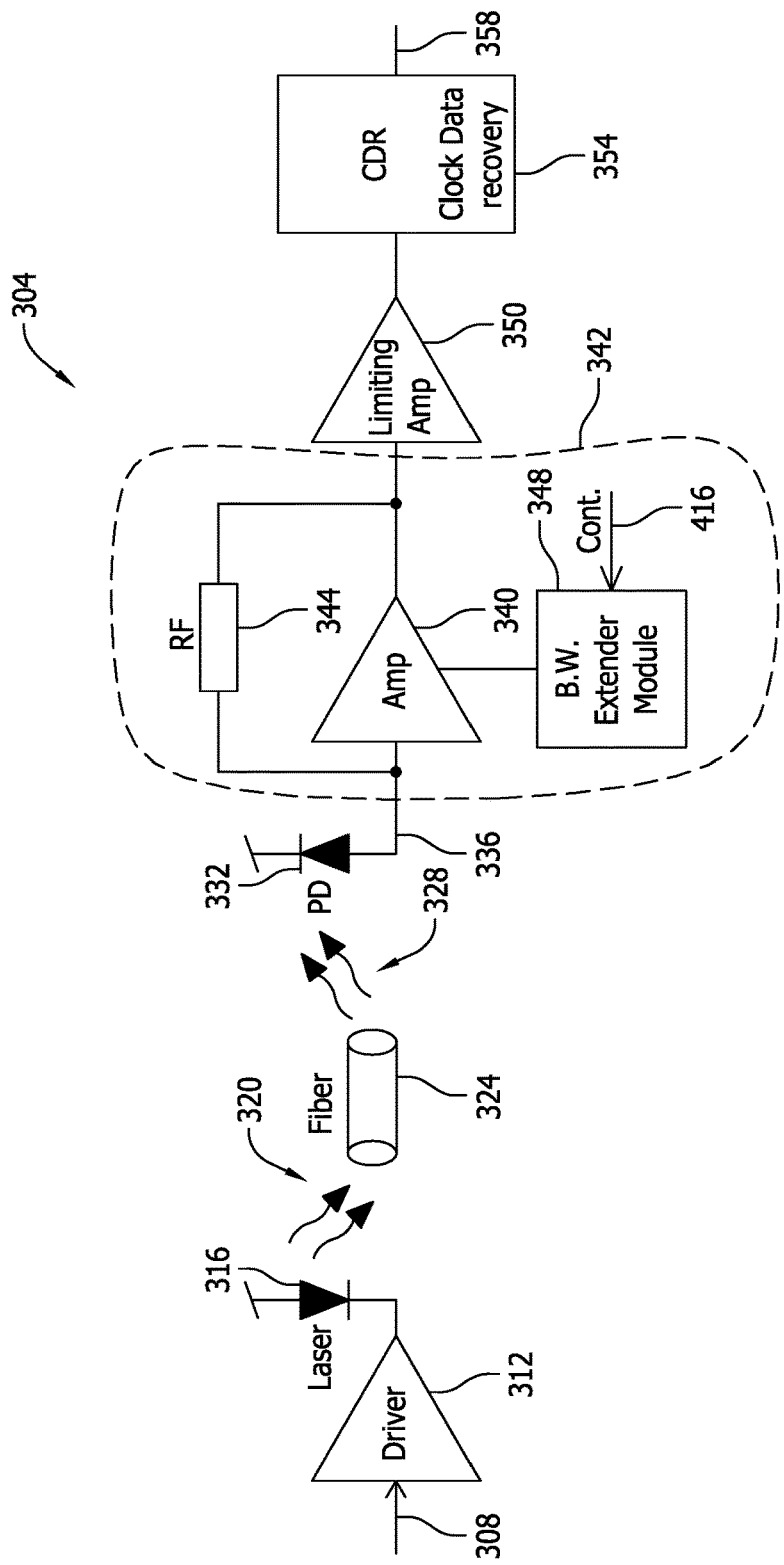
FIG. 3 illustrates an exemplary environment of use of the improved TIA design as disclosed herein.

FIG. 3 illustrates an exemplary environment of use of the improved TIA design as disclosed herein. This is but one possible example embodiment and it is contemplated that the improved TIA design may be used in any environment that utilizes a TIA. This example environment is in a fiber link 304 between and as part of communication devices. As shown, an input signal 308 is presented to a laser driver 312. The driver 312 amplifies the signal to a magnitude and current level suitable for driving an optical signal generator 316, such as a laser or any other optical signal generating device. The optical signal generator 316 creates an optical signal 320 which is presented to a fiber optic or other transmission medium. At an opposing end of the fiber 324 the received optical signal 328, which is degraded due to passage through the fiber 324, is presented as an output.

A photodetector 332, such as a photodiode, receives the optical signal 328 and converts the optical signal 328 to an electrical signal on an amplifier input node 336. The amplifier 340, which is part of the TIA 342, amplifies the input signal from the photodetector 332 and provides the amplified signal as an output. In this embodiment, the amplifier 340 converts an input current to an output voltage. The output is presented to a feedback resistor RF 344 and as an input to a limiting amplifier 350. The amplifier output provided to the feedback resistor 344 is presented as a feedback signal to the input of the amplifier 340. The feedback resistor 344 sets the gain based on the Vout/Iin relationship.

Also part of the TIA 342 is a bandwidth extender module 348 that connects to the amplifier 340, or to the input and output of the amplifier. The bandwidth extender module 348 is discussed below in more detail. The bandwidth extender module 348 may be selectively enabled to selectively increase or decrease the bandwidth of the TIA. A control input 346 provides a control signal to the bandwidth extender module 348 to selectively enable and disable the bandwidth extender module.

The limiting amplifier 350 may be a RF and microwave limiting amplifiers which may be manufactured with thin film hybrid manufacturing techniques or any other manufacturing process to maximize performance, repeatability, and reliability. The frequency range may be from 10 MHz to 4 GHz, or higher than 4 GHz. In this embodiment the input signal to the limiting amplifier may be distorted to rail to rail output in order to give a large signal to the other parts of the Rx (such as a clock data recovery circuit). The limiting amplifier may be configured to perform amplitude compression by performing a limiting function, which will protect subsequent components from input overdrive.

The output of the limiting amplifier 350 is presented to clock data recovery circuit (CDR) 354. The CDR 354 aligns the data signal with the clock signal. As is understood, some data streams, especially high-speed serial data may be sent without an accompanying clock signal and thus must be synchronized with a clock signal at a receiver. The receiver generates a clock from an approximate frequency reference, and then phase-aligns to the transitions in the data stream with a phase-locked loop (PLL). This process is commonly known as clock and data recovery. The output of the CDR 354 is presented to one or more downstream processing elements, such as an analog to digital converter.

Figure 4:
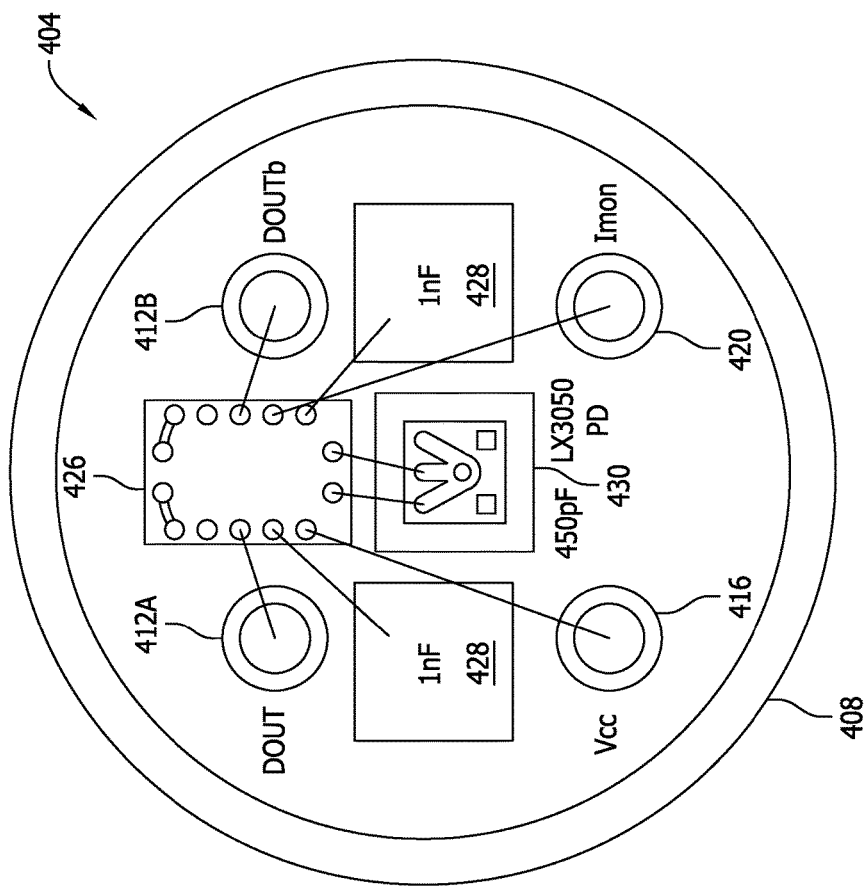
FIG. 4 illustrates an exemplary TIA and photodetector located in a receiver optical sub assembly (ROSA).

FIG. 4 illustrates a TIA and photodetector located in a receiver optical sub-assembly (ROSA). This is but one possible example embodiment and as such different configurations are possible without departing from the claims that follow. The ROSA module 404 includes a housing 408 that is configured to house and protect the electronics contained within the housing and to mate with a fiber optic cable. Inside the ROSA 404 are four connectors or pins to which subsequent electronics, such as the limiting amplifier connect. These pins are the outputs 412A, 412B which carry the electrical output signal in a differential format. Additional pins include a supply voltage Vcc 416 and a monitor current output (Imon) 420. The supply voltage pin 416 supplies power to the ROSA while the current monitor output pin 420 monitors output current.

Connected to the pins 412A, 412B, 416, 420 is a transimpedance amplifier (TIA) 426. The TIA 426 receives an electrical input from the photodetector 430 which has associated capacitance, in this embodiment 0.35 Pico farads. Also located on the ROSA 428 are one or more capacitors 428, in this embodiment, one nano farad.

Figure 1:
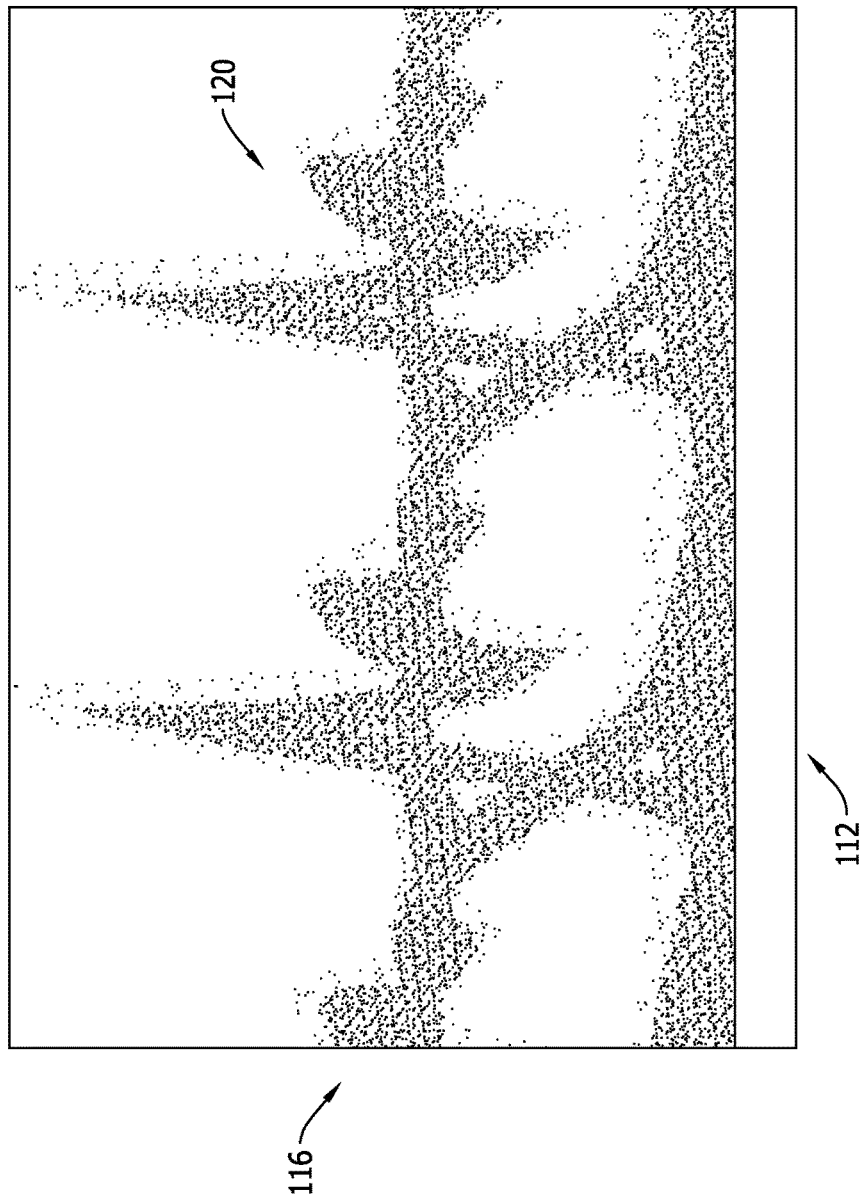
FIG. 1 illustrates an exemplary plot of optical signal magnitude over time showing coherent optical feed-back.
Figure 2A:
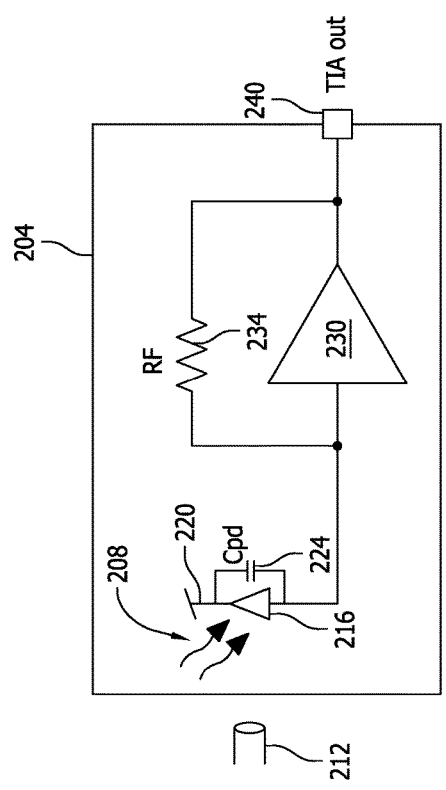
FIG. 2A illustrates a prior art single stage transimpedance amplifier.
Figure 2B:
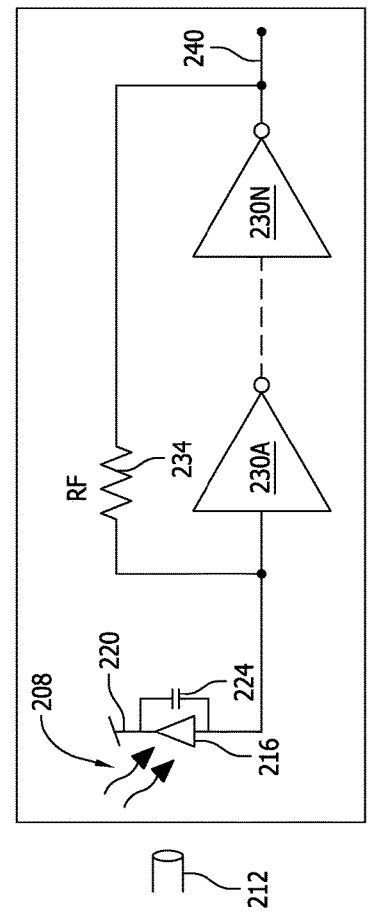
FIG. 2B illustrates a prior art multistage-stage transimpedance amplifier.
Figure 5:
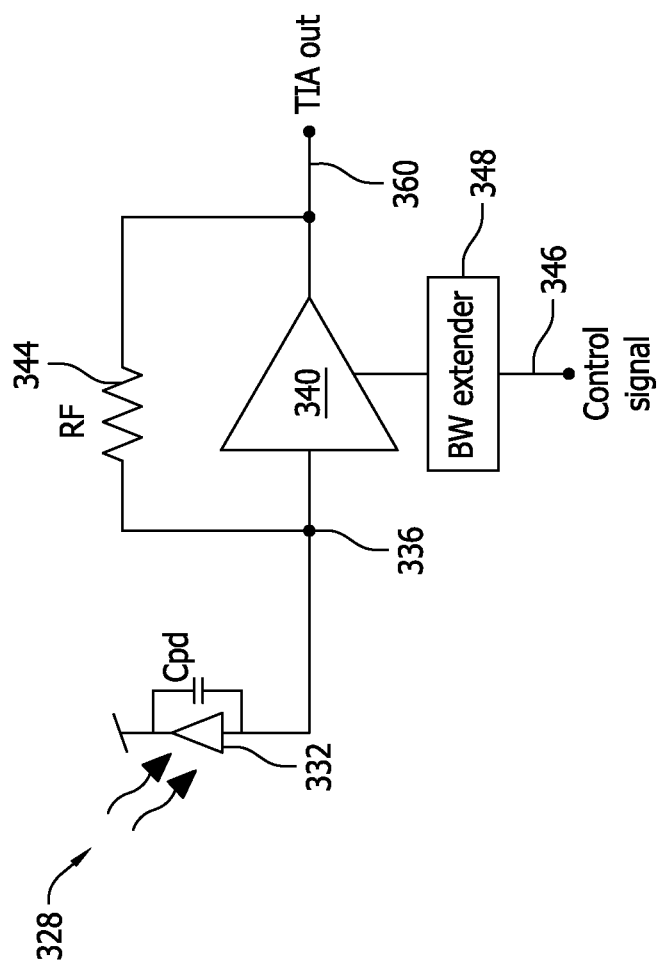
FIG. 5 illustrates an exemplary TIA with a bandwidth extender circuit.

FIG. 5 illustrates a TIA with a bandwidth extender circuit. The discussion of the TIA associated with FIG. 3 is repeated herein. Similar elements are identified with identical reference numbers. A photodetector 332, such as a photodiode, receives the optical signal 328 and converts the optical signal 328 to an electrical signal on an amplifier input node 336. The amplifier 340, which is part of the TIA 342, amplifies the input signal from the photodetector 332 and provides the amplified signal as an output on an output node 360. In this embodiment, the amplifier 340 converts an input current to an output voltage. The output is presented to a feedback resistor RF 344 and as an input to a limiting amplifier 350. The amplifier output provided to the feedback resistor 344 is presented as a feedback signal to the input of the amplifier. The feedback resistor 344 sets the gain based on the Vout/Iin relationship. This configuration may be expanded to additional stages as would be understood from FIG. 2B and FIG. 6 described below.

Also part of the TIA 342 is a bandwidth extender module 348. That connects to the amplifier 340, in this embodiment to the input and output of the amplifier. The bandwidth extender module 348 is discussed below in more detail. The bandwidth extender module 348 may be selectively enabled to selectively increase or decrease the bandwidth of the TIA. A control input 346 provides a control signal to the bandwidth extender module 348 to selectively enable and disable the bandwidth extender module.

Figure 6:
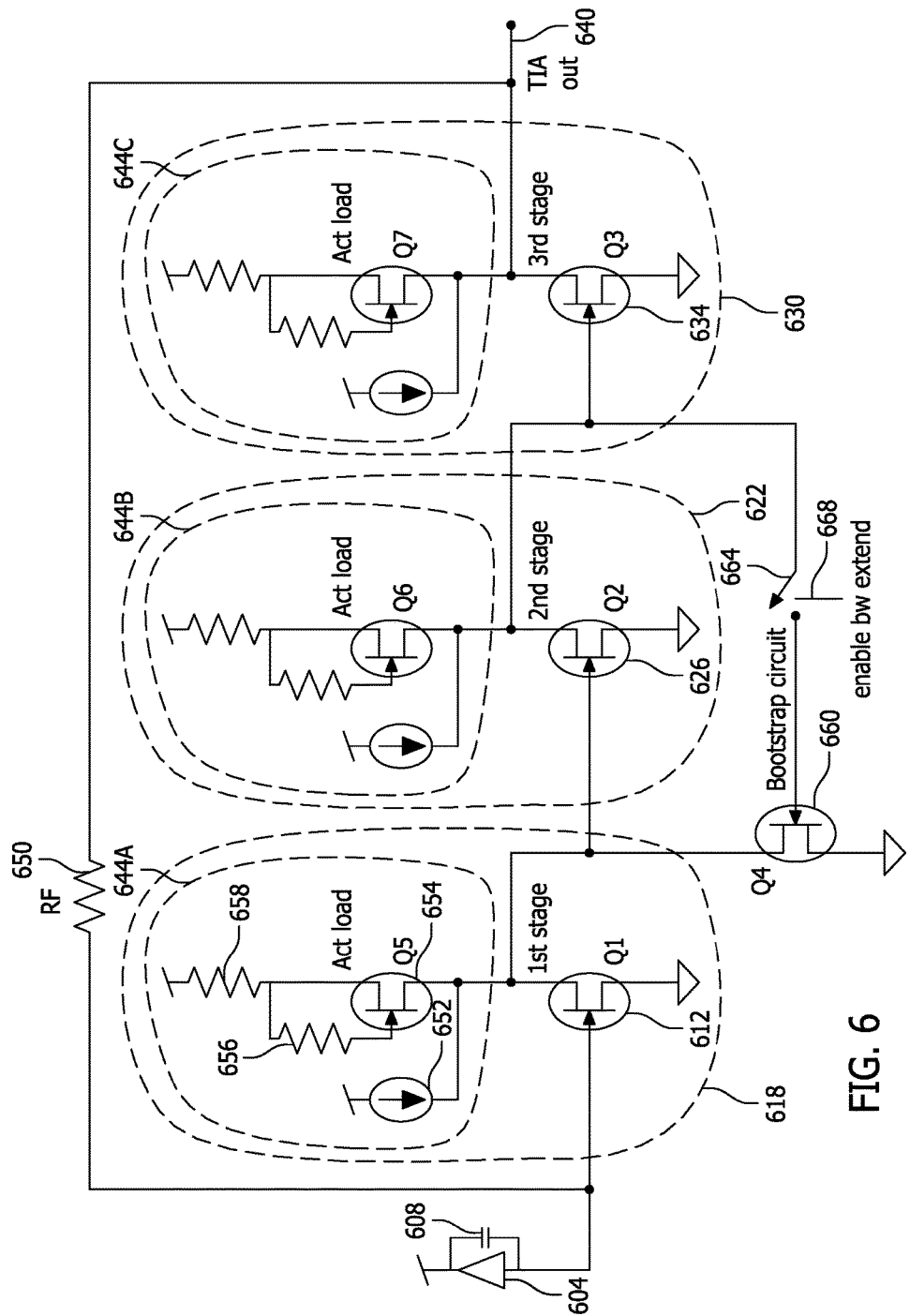
FIG. 6 illustrates an exemplary circuit level diagram of a 3 stage TIA design with bandwidth extender.

FIG. 6 illustrates a circuit level diagram of a 3 stage TIA design with bandwidth extender. This is but one possible circuit level implementation with a focus on the components of interest. Other embodiments are contemplated that may differ in configuration yet do not depart from the claims that follow. In this example embodiment, a photodetector 604 has an associated capacitance 608 (shown as a separate element but is typically part of the photodetector itself). The photodetector 604 is configured or positioned to receive an optical signal, such as from a fiber optic cable (not shown). An output of the photodetector 604 connects to a gate terminal of a field effect transistor (FET) Q1 612. The FET Q1 612 has a source terminal connected to ground and a drain terminal connected to an active load 644A, (which is described below in greater detail) and to a second stage FET 626 of the TIA. The elements in dashed lines form the first stage 618 of the TIA.

The drain terminal of the FET Q1 612 connects to the second stage 622 of the TIA, and in particular to a gate terminal of FET Q2 626. A source terminal of the FET Q2 626 connects to ground while a drain terminal of the FET Q2 connects to an active load 644B which is described below in detail, and to a third stage 630 of the TIA. The third stage 630 includes a FET Q3 634 that has a source terminal connected to ground and a drain terminal connected to an active load 644C (which is described below in greater detail) and to an output node 640 of the TIA.

A feedback loop connects between the output of the photodetector 604 (input to the TIA) and the output node 640 as shown. A feedback resistor 650 is part of the feedback loop. The feedback loop provides negative feedback to the input while the feedback resistor 650 converts input current to a voltage. Gain is set by the value of the feedback resistor 650.

Associated with each stage are active loads elements 644A, 644B and 644C. Each of these active load elements are generally similar and as such, only one is described in detail below. In reference to active load element 644A, a source terminal of a FET Q5 654 connects to the drain terminal of FET Q1 612 as shown. A current source 652 provides an input current to the node established between the FET Q1 612 and the FET Q5 654. A resistor 656 connects between the gate terminal and the drain terminal of the FET Q5 654. A resistor 658 connects the drain terminal of the FET Q5 to a power supply node.

In operation, the active load element 644A provides a load to the first stage FET Q1 612 to tune transfer curves and increase linearity of the TIA. This is but one possible example implementation of an active load element in a TIA and the load may change with design or application. The bandwidth extender disclosed herein can work with any TIA and with or without an active load element.

Shown at the bottom FIG. 6 is the selectively enabled bandwidth extender. In this embodiment it includes a transistor Q4 660 is part of a feedback loop from the gate terminal of a third stage FET Q3 634 and the gate terminal of the second stage FET Q2 626. Although transistor Q4 660 as shown as a FET, any type active device may be used. Also part of the bandwidth extender loop is a switch 664 responsive to a control input 668 (enable BW extend) to selectively allow the bandwidth extender to be enabled and made a part of the TIA.

In operation, the transistor Q4, when enabled by the enable BW extend signal, amplifies the feedback signal from the third stage to the output of the first stage (input to the second stage). In this embodiment, the feedback is positive feedback. Active device 660 is selected to have an amount of gain which maintains stability in the bandwidth extender feedback loop. If the active device 660 is too large, then peaking may occur such that high frequency gain will result in oscillation. If the gain is too low, then the bandwidth enhancement does not occur and there is no difference or inadequate improvement in circuit performance. Thus, bandwidth extension is desired but without overshoot or ringing. One exemplary method for selection of an active device 660 which yields a desired gain is through circuit simulation.

By providing positive feedback with gain from the input to the third stage TIA to the output of the first stage TIA, the open loop gain is increased. It is desired to have the input referred noise to be as low as possible. The bandwidth extender provides positive feedback to increase the output impedance of the first stage to reduce loading of the first stage.

Although the bandwidth extender is described herein as an enable or disable signal, such as a single bit signal, it is also contemplated that the control signal may be a multibit signal which sets varying level of positive feedback to the proceeding stages of the amplifier stages. For example, with a two bit control input, additional levels of control are available to custom tailor the amount of bandwidth extending gain is presented as positive feedback.

Figure 7:
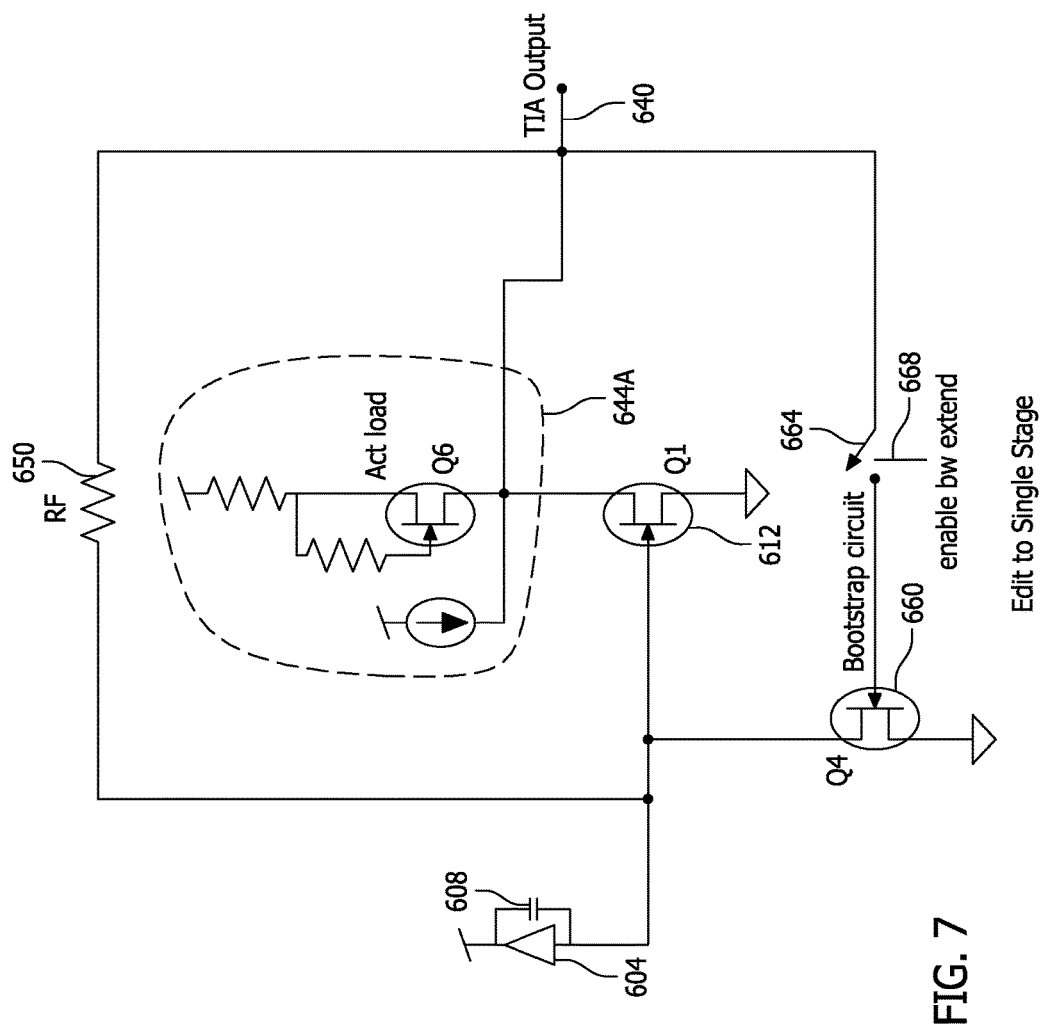
FIG. 7 illustrates an exemplary single stage TIA with a bandwidth extender.

FIG. 7 illustrates a single stage TIA with a bandwidth extender. As compared to FIG. 6, similar elements are labeled with common referenced numbers. Because this is a single stage embodiment, the values of each individual component will vary from the embodiment of FIG. 6. As shown, the output 640 of the TIA feeds into a gate terminal of the transistor 612. The source terminal of the transistor 612 connects to ground while the drain terminal connects to the active load 644A.

The TIA output node is the drain terminal of the transistor 612. The feedback resistor RF 650 connects between the input to the gate terminal of the transistor 612 and the output node 640.

In this single stage embodiment the bandwidth extender feedback loop is configured the same as in FIG. 6 with the active element 660 and switch 664 connected between the output node 640 and the input (gate terminal) to the transistor 612. Operation of the bandwidth extender is generally identical but the values and/or sizes of each element may vary.

Figure 8:
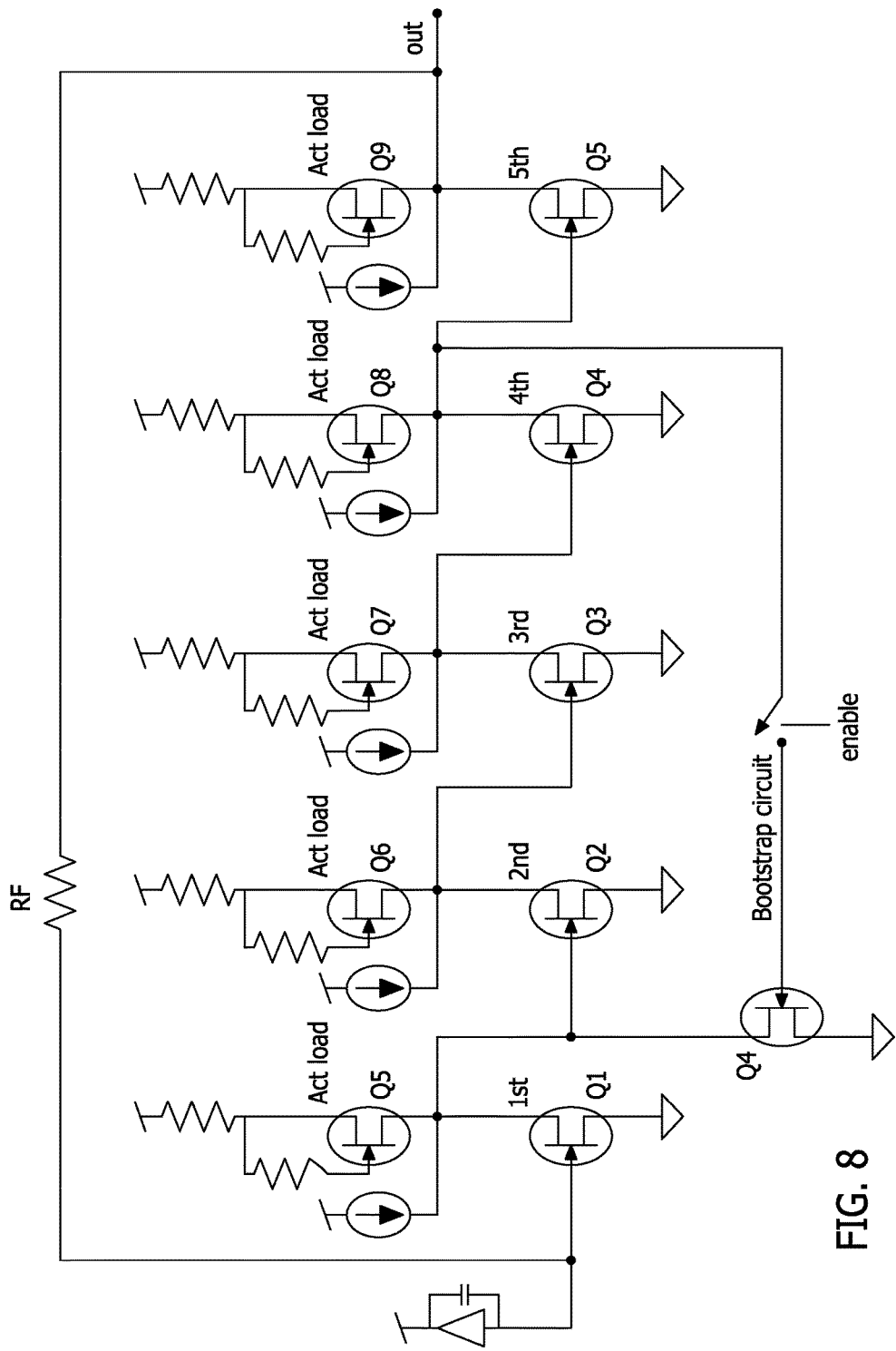
FIG. 8 illustrates an example embodiment of a five stage TIA with a bandwidth extender.

FIG. 8 illustrates an example embodiment of a five stage TIA with a bandwidth extender. As compared to FIGS. 6 and 7, identical elements are labeled with identical reference numbers. In this embodiment the feedback resistor connects to the input to the first stage FET and the output node. The bandwidth extender connects between the output of the first stage and the input to the fifth (last) stage. Operation of the bandwidth extender is generally identical but the values and/or sizes of each element may vary.

Figure 9:
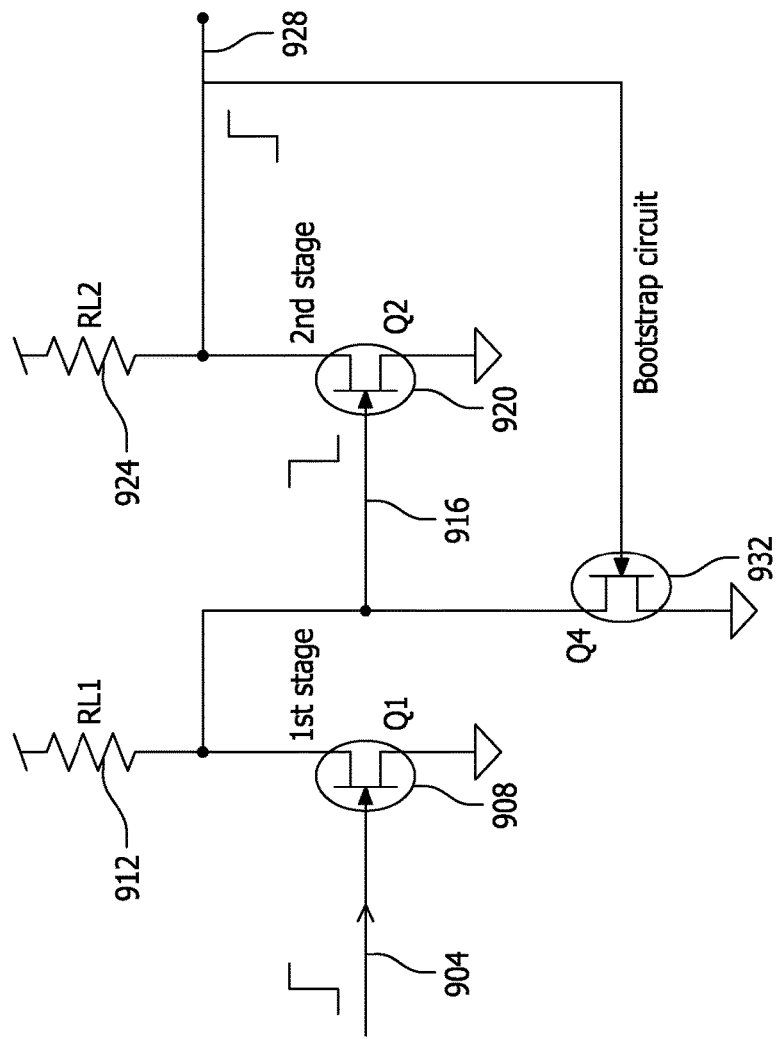
FIG. 9 illustrates a simplified circuit diagram of a two stage TIA with bandwidth extender presented for discussion purposes.

FIG. 9 illustrates a simplified circuit diagram of a two stage TIA with bandwidth extender presented for discussion purposes. In this example circuit diagram, an input 904 is present to receive a signal. Although shown in other embodiments as receiving a signal from a photodetector, it is contemplated and expected that any embodiment herein may be paired with devices other than a photodetector or optical front end.

The input 904 connects to a first stage transistor 908 at a gate terminal. The source terminal of the first stage transistor 908 connects to ground while the drain terminal connects to a first resistor 912. The output node 916 of the first stage transistor 908 feeds into a gate terminal of a second stage transistor 920. The source terminal of the second stage transistor 920 connects to ground while the drain terminal connects to a second resistor 924.

The output of the second stage transistor 920 is presented on an output node 928. A feedback loop extends from the output node 928 to the node 916. A third transistor 932 is located in the feedback loop as shown connected between the gate terminal and drain terminal.

Using FIG. 9 as a guide, the method and apparatus disclosed herein has many advantages over the prior art. Multistage inverter TIA designs had been popular in achieving high sensitivity to support 2.5 Gbps GPON (gigabit passive optical network) applications. For example, GPON systems, have been shown to achieve over −31 dBm of sensitivity by reducing the input referred noise (IRN) to less than 90 nA rms. However, as discussed above are two major drawbacks with existing TIA topologies: 1) sensitivity performance is highly depended on the input photodiode capacitance. 2) There is no provision to effectively suppress laser relaxation oscillation.

The transimpedance amplifier (TIA) with bandwidth extender technique overcomes these drawbacks. The simplified two stage design shown in FIG. 9 aids in the understanding of these benefits and how the prior art issues are overcome. The gain of the bandwidth extender (feedback loop with the third transistor 932) is defined as gm4*RL1. Without the third transistor 932 gain "gm4*RL1" (which may be referred to as a bootstrapping factor), the gain of the 1st stage is reduced to "gm1*RL1". RL1 is the resistance value of the first resistor 912 and the term gm1 is defined as transconductance, which is a measure of the conductance of a component. RL is the active or passive load. Gm of the device controls or is an aspect that affects gain.

The gain of the bandwidth extender is defined as gm4*RL1 and thus increases the gain and the effective output impedance of the first stage (elements 908, 912). Because the first stage gain is increased, the TIA's open-loop gain, defined as Ao (open loop gain), is increased also.

Working from the basic TIA feedback equation which defines bandwidth as BW=(1+Ao)/(Cin*Rf) where Cin is the photodiode capacitance Cpd plus the amplifier input capacitance Cg, while Rf is the shunt feedback resistor. This equation shows that the TIA's bandwidth will be extended by higher open loop gain Ao, created by the feedback gain from the bandwidth extender. Increases in the value of Ao increase bandwidth of the TIA. Increasing the value of RL (shown in FIG. 9) and the feedback that causes the gain of the first stage to appear higher and that causes the increase in bandwidth.

The equations that define gain of the first stage are thus defined as:

W/O Bootstrap=$gm1*RL1$

W/Bootstrap=$(gm1*RL1)+(gm4*RL1)$

Therefore, by enabling the bandwidth extending loop, the loss of bandwidth due to higher input capacitance of the photodetector can be compensated. This allows a wider range of photodetectors to be used, which can add design flexibility and allows for use of reduced cost photo detectors.

As shown in FIG. 6, a switch may be presented in any embodiment of the bandwidth extender feedback loop as shown in FIG. 6. By disabling the bandwidth extender, such as by opening a switch or any other means, the bandwidth extender is disabled and the output impedance of the first stage will be decreased and thus bandwidth is reduced accordingly. Thus, the bandwidth extender may be selectively enabled and disabled. By disabling the bandwidth extender the bandwidth is reduced, which provide the benefit of limiting the TIA's bandwidth offers an opportunity to filter out the high frequency content of the relaxation oscillation signal by suppressing it at the input. Stated another way, by limiting the TIA bandwidth the laser relaxation effect can be suppressed. Therefore, it is also desirable to have the option of reducing the TIA bandwidth (by disabling the bandwidth enable circuit or loop) to accommodate inexpensive lasers to further reduce the overall receiver system cost.

Figures 10A, 10B:
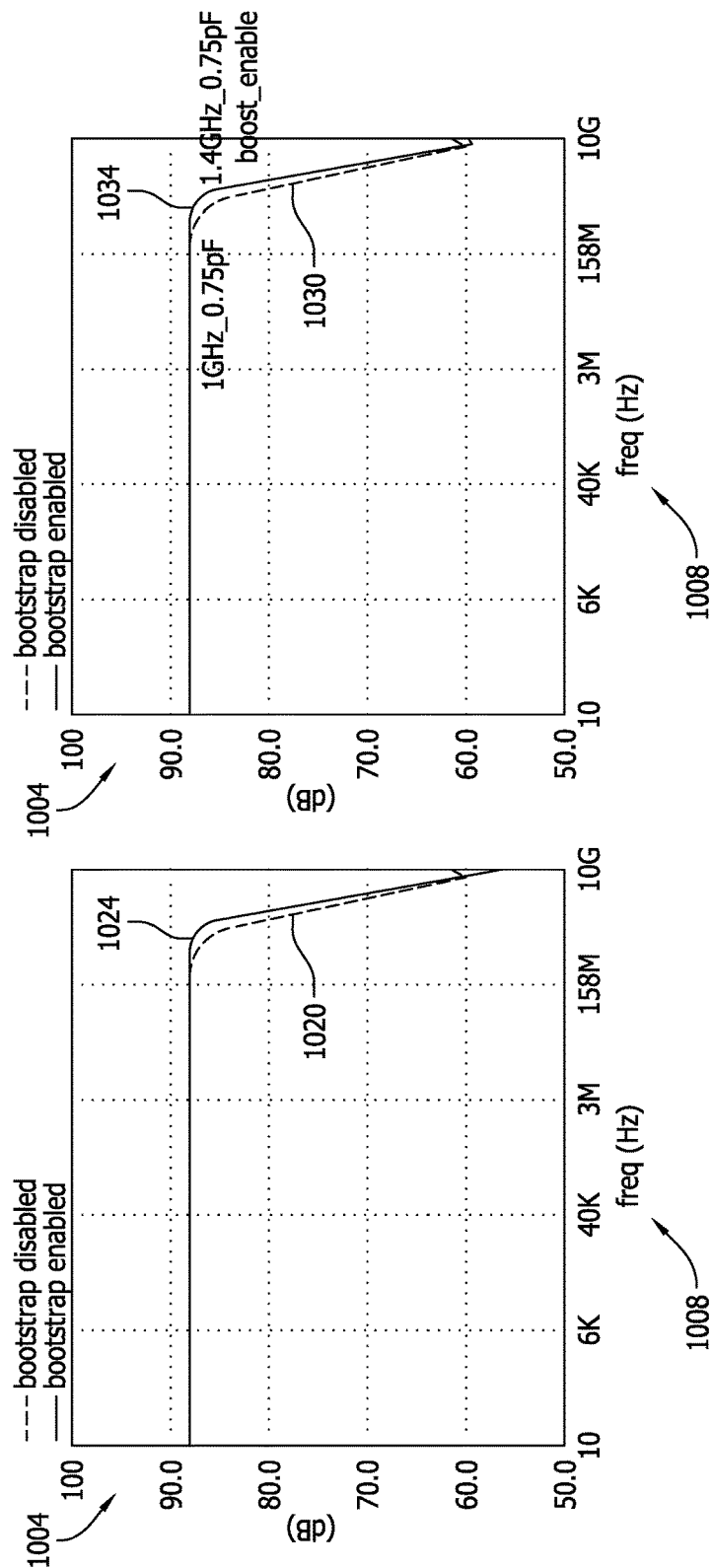
FIGS. 10A and 10B illustrates exemplary plots of bandwidth versus frequency without and with the bandwidth extender.

FIGS. 10A and 10B illustrates exemplary plots of bandwidth in relation to output frequency with and without the bandwidth extender. These plots are from simulations of actual circuit performance but are exemplary only and other embodiments and elements may yield different numeric values. In both FIGS. 10A and 10B, the vertical axis 1004 represents gain while the horizontal axis represents frequency.

In FIG. 10A, the two plots are both without the bandwidth extender features present in the circuit, or if present, not enabled. The first plot 1020 is with the capacitance of the photodetector at 0.75 pico-farads. Thus, with the moderately high photodetector input capacitance the gain falls off at higher frequency. Based on these circuit test results, the TIA would not be suitable for use at 2.5 Gbps. The second plot 1024 is with the capacitance of the photodetector at 0.15 pico-farads. Thus, the lower photodetector input capacitance allows the suitable gain to be extended to higher frequencies as compared to plot 1020. However, it is contemplated that the 0.15 pico-farads photodetector would cost considerably more than the photodetector with a capacitance of 0.75 pico-farads.

Turning to FIG. 10B, both plots are created with a photodetector with a high capacitance of 0.75 pico-farads. A third plot 1030 is without the bandwidth extender while a fourth plot 1034 is with the bandwidth extender enabled. As shown, the gain of the plot 1030 drop off at higher frequency but when the bandwidth extender is enabled, such as by being switched it into the TIA circuit, the gain at higher frequency increases, thereby enabling operation at higher frequencies. In this example embodiment, the bandwidth is improved by 40% over the situation with the bandwidth extender is not enabled. This is a significant performance increase given the complexity and cost of the bandwidth extender.

Figure 11:
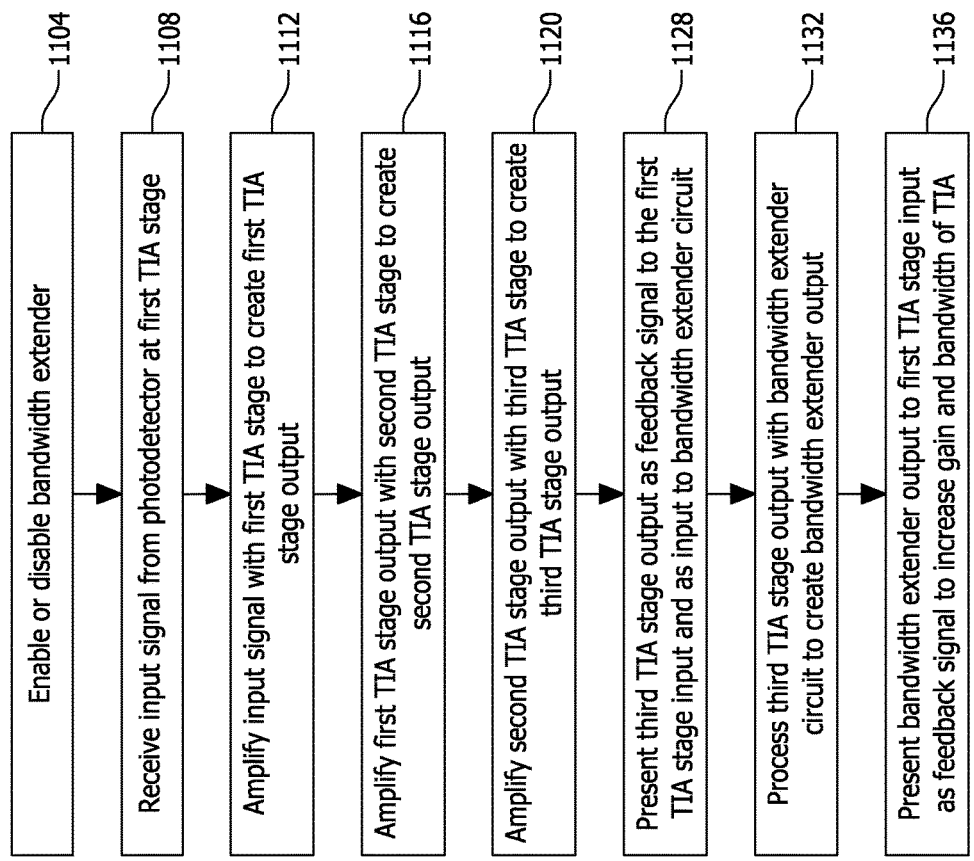
FIG. 11 of a flow chart of an exemplary method of operation of the TIA with bandwidth extender.

FIG. 11 of a flow chart of an exemplary method of operation of the TIA with bandwidth extender. This is but one method of operation and it is contemplated that other methods of operation may occur without departing from the claims that follow. At a step 1104 the bandwidth extender circuit or feedback path is enabled or disabled. This may occur based on a control signal from a controller or other element configured to automatically detect operation parameters. The enable signal may also be manually set, such as by a user or system operation. This step may also occur during operation such as by comparing bit error rates or other performance parameters by automatically comparing performance with and without the bandwidth extender and selecting the option that yields the best performance.

At a step 1108, the TIA receives the input signal from a photodetector at a first stage of the TIA. As discussed below, additional feedback signals are also received at the TIA input and processed during operation. Then at a step 1112, the first TIA stage amplifies the input signal to create a first TIA output signal. At a step 1116, the system amplifies the first TIA stage output and a feedback signal from a bandwidth extender with a second TIA stage to create a second TIA output. At step 1120 the second TIA output is presented to a third TIA stage and the third TIA stage amplifies the third TIA stage output. Then, at a step 1128 the third TIA stage amplifies the second TIA output to create the TIA output. In this example method of operation there are three TIA stage but in other embodiment a greater or fewer number of TIA stages may be present.

At a step 1128 the TIA output, which is the output from the third TIA stage, is presented as a feedback signal to the TIA input, through a feedback resistor. At a step 1132, the bandwidth extender device or circuit processes the TIA output to create a bandwidth extender output. At a step 1136 the output of the bandwidth extender is presented as a feedback signal to an earlier TIA stage, such as the second TIA stage. This input from the bandwidth extender increases the gain of the first stage, thereby increasing the bandwidth capabilities of the TIA.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A photodetector with a transimpedance amplifier comprising:

a photodetector configured to receive and process an optical signal to generate a photodetector output that represents the optical signal;

a transimpedance amplifier having a transimpedance amplifier input and a transimpedance amplifier output, the transimpedance amplifier input configured to receive the photodetector output, the transimpedance amplifier including;

a first stage comprising a transistor and a load element, the first stage connected to the photodetector output and having a first stage output;

a second stage comprising a transistor and a load element, the second stage connected to the first stage output and having a second stage output;

a third stage comprising a transistor and a load element, the third stage connected to the second stage output and forming the transimpedance amplifier output;

a first feedback loop including feedback resistor, the feedback loop connected between to the transimpedance amplifier output and the transimpedance amplifier input; and a bandwidth extender including an active element, a bandwidth extender connected between the first stage output and the second stage output.

2. The photodetector with a transimpedance amplifier of claim 1, wherein the active element in the bandwidth extender is a FET such that the FET has a gate terminal connected to the second stage output and a drain terminal connected to the first stage output.

3. The photodetector with a transimpedance amplifier of claim 1, wherein the bandwidth extender is configured to provide positive feedback from the second stage output to the first stage output to increase the gain of the transimpedance amplifier.

4. The photodetector with a transimpedance amplifier of claim 1 further comprising a switch configured to receive an enable signal that selectively enables or disables the bandwidth extender.

5. The photodetector with a transimpedance amplifier of claim 1 wherein the first stage, second stage, and third stage include a FET acting as an amplifier and an active load or a passive load.

6. A method for processing a photodetector output with a transimpedance amplifier to generate a corresponding amplified voltage comprising:

receiving the photodetector output current at a first stage amplifier of the transimpedance amplifier having one or more amplifier stages;

receiving a feedback signal from a feedback path at the first stage amplifier, the feedback path including feedback resistor;

amplifying the feedback signal and the photodetector output with the one or more amplifier stages to generate a transimpedance amplifier output signal;

presenting the transimpedance amplifier output signal as an input to the feedback path;

performing bandwidth enhancement by amplifying an amplifier stage output signal from one of the one or more amplifier stages and presenting the amplified amplifier stage output signal as positive feedback to an input of the one or more amplifier stages to increase the gain of at least one amplifier stage of one or more amplifier stages of the transimpedance amplifier to thereby increase the bandwidth of the transimpedance amplifier.

7. The method of claim 6, further comprising receiving a control signal to selectively enable or disable bandwidth enhancement.

8. The method of claim 6 further comprising detecting, such as by filtering, unwanted high frequency content in the transimpedance amplifier input or photodetector output and responsive thereto disabling the bandwidth enhancement.

9. The method of claim 6 wherein the one or more stages comprises three stages.

10. The method of claim 6 wherein the photodetector or transimpedance amplifier operates at multi-data rates, higher or lower than 2.5 Gbps.

11. The method of claim 6 wherein the method is performed in a ROSA or other type optical packages of a passive optical network.

12. The method of claim 6 wherein performing bandwidth enhancement by amplifying an amplifier stage output signal.

* * * * *